(12) United States Patent
Ishikura et al.

(10) Patent No.: US 10,629,837 B2
(45) Date of Patent: Apr. 21, 2020

(54) TOP EMISSION ORGANIC EL ELEMENT AND MANUFACTURING METHOD THEREOF

(71) Applicant: CANON KABUSHIKI KAISHA, Tokyo (JP)

(72) Inventors: Junri Ishikura, Tokyo (JP); Norihiko Ochi, Kawasaki (JP); Naoari Shibata, Kawaguchi (JP); Masayuki Morohashi, Kawasaki (JP); Shigeki Kondo, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/199,614

(22) Filed: Nov. 26, 2018

(65) Prior Publication Data

US 2019/0173039 A1 Jun. 6, 2019

(30) Foreign Application Priority Data

Dec. 1, 2017 (JP) .................................. 2017-232095

(51) Int. Cl.

| H01L 51/50 | (2006.01) |
| H01L 51/00 | (2006.01) |
| H01L 51/52 | (2006.01) |
| H05B 33/22 | (2006.01) |
| H01L 27/32 | (2006.01) |
| H05B 33/14 | (2006.01) |
| H01L 29/49 | (2006.01) |
| H01J 9/00  | (2006.01) |

(52) U.S. Cl.
CPC ............ *H01L 51/5088* (2013.01); *H01J 9/00* (2013.01); *H01L 27/3246* (2013.01); *H01L 27/3276* (2013.01); *H01L 27/3295* (2013.01); *H01L 29/4908* (2013.01); *H01L 51/0005* (2013.01); *H01L 51/0037* (2013.01); *H01L 51/0052* (2013.01); *H01L 51/5221* (2013.01); *H01L 51/5246* (2013.01); *H05B 33/14* (2013.01); *H05B 33/22* (2013.01)

(58) Field of Classification Search
None
See application file for complete search history.

(56) References Cited

U.S. PATENT DOCUMENTS

| 6,741,386 | B2 * | 5/2004 | Minami ................. G02B 26/02 359/243 |
| 8,128,448 | B2 * | 3/2012 | Seki .................... H01L 27/3223 257/40 |
| 2010/0181559 | A1 * | 7/2010 | Nakatani ............ H01L 27/3246 257/40 |

FOREIGN PATENT DOCUMENTS

JP H11-329741 A 11/1999

\* cited by examiner

*Primary Examiner* — Ashok Patel
(74) *Attorney, Agent, or Firm* — Venable LLP

(57) ABSTRACT

A manufacturing method of a top emission organic EL element includes a step of providing an insulating layer on a substrate, a processing step of processing a center area within a region in which the insulating layer is provided, a step of forming a bank on the insulating layer, a lower electrode material applying step, a luminescent material applying step, and an upper transparent electrode forming step. The insulating layer is provided such that a contact angle to a solution to be applied in forming a lower electrode becomes smaller at the center area than the contact angle at a peripheral area within the region.

8 Claims, 5 Drawing Sheets

PRIOR ART

TOP EMISSION ORGANIC EL ELEMENT AND MANUFACTURING METHOD THEREOF

BACKGROUND OF THE INVENTION

Field of the Invention

The present invention relates to a top emission organic EL element and a manufacturing method thereof and more specifically to a top emission organic EL element including a lower electrode capable of enhancing light extracting efficiency and a manufacturing method thereof.

Description of the Related Art

An organic EL element is an element in which a light emitting layer is formed of a low-molecular organic compound or a high molecular organic compound having EL light emitting ability. Because the organic EL element has excellent features as a display element such as a wide viewing angle due to its spontaneous light emitting property and excellent impact resistance, the organic EL element is being actively studied and developed.

As its manufacturing method, a vacuum deposition method, an inkjet method, a printing method, a dispensing method and the like are widely studied. Above all, coating technique such as the inkjet method and the dispensing method is expected to be a technique suitable for mass-production because its system can be downsized as compared to that of the vacuum deposition method and excels in material utilizing efficiency. While it is necessary to laminate a number of layers such as an electrode, a light emitting layer, an intermediate layer and the like in order to manufacture the organic EL element, it may be desirable to manufacture the number of layers by a liquid-phase coating technique in order to enhance mass-productiveness. Japanese Patent Application Laid-open No. H11-329741 proposes a method of forming an electrode, a hole transport layer and the like other than the light emitting layer by coating.

While an organic EL element includes a top emission type of extracting light above laminated films and a bottom emission type of extracting light through a substrate, a lower electrode on the substrate side is required to have high light reflectivity in order to enhance light extracting efficiency in the top emission type organic EL element.

In a case of manufacturing the lower electrode on the substrate side by the liquid-phase coating technique, a region surrounded by a bank is formed on the substrate at first. Then, a solution in which nanoparticles of copper and/or silver are dispersed is coated on the region surrounded by the bank. After that, the region is baked in high temperature.

While a liquid surface is flat or a center area thereof rises right after when the solution in which the copper and/or silver nanoparticles are dispersed is coated in the region surround by the bank, a flow heading from the center area to an edge part is generated in a process in which drying advances. The nanoparticles within the solution move toward the edge part by joining with this flow. As a result, while the edge part of an electrode film raises high by being packed with the dense nanoparticles, the center area becomes thin by being packed with the low density nanoparticles in contrary. Still further, in addition to the influence of the flow in the drying process, a shape of the film to be formed and the packing density of the nanoparticles are influenced by a contact angle of the ink in which the nanoparticles are dispersed to the face of the bank. In a case where affinity of the surface of the bank with the ink is high, the solution is liable to be attracted more to the bank and the flow heading toward the edge part is enhanced more. Due to that, the packing density of the nanoparticles is liable to be low and a thickness is liable to be thin at the center area of the film. As a result, film quality of the lower electrode reflects the condition during drying, and the center area has low density in terms of the nanoparticles and is thin as compared to those of the peripheral area even after baking.

If the center area of the lower electrode on the substrate has the low density and is thin, light reflection efficiency of this part becomes low and drops light extracting efficiency in the top emission element.

Then, it has been required to develop a technology of readily manufacturing the top emission organic EL element having high light extracting efficiency while fully assuring the density and the thickness of the lower electrode even around the center area in the region surrounded by the bank.

SUMMARY OF THE INVENTION

According to a first aspect of the present invention, a manufacturing method of a top emission organic EL element includes a step of providing an insulating layer on a substrate, a processing step of processing a center area within a region in which the insulating layer is provided such that a contact angle to a solution to be applied in forming a lower electrode becomes smaller at the center area than at a peripheral area within the region, a step of forming a bank on the insulating layer so as to surround the center area, a lower electrode material applying step of applying a solution containing materials of the lower electrode to the region surrounded by the bank, a luminescent material applying step of applying a solution containing materials of a light emitting layer to the region surrounded by the bank after the lower electrode material applying step, and an upper transparent electrode forming step of forming an upper transparent electrode after the luminescent material applying step.

According to a second aspect of the present invention, a top emission organic EL element includes a lower electrode, a light emitting layer, a bank surrounding the lower electrode and the light emitting layer, and an upper transparent electrode. A base of the lower electrode is what a contact angle to a coating solution to be applied in forming the lower electrode is smaller at the center area than at a peripheral area.

Further features of the present invention will become apparent from the following description of exemplary embodiments with reference to the attached drawings.

DESCRIPTION OF THE EMBODIMENTS

First Embodiment

A top emission organic EL element and a manufacturing method thereof of a first embodiment of the present disclosure will be described with reference to the drawings.

Structure of Organic EL Element

Figure 1A:
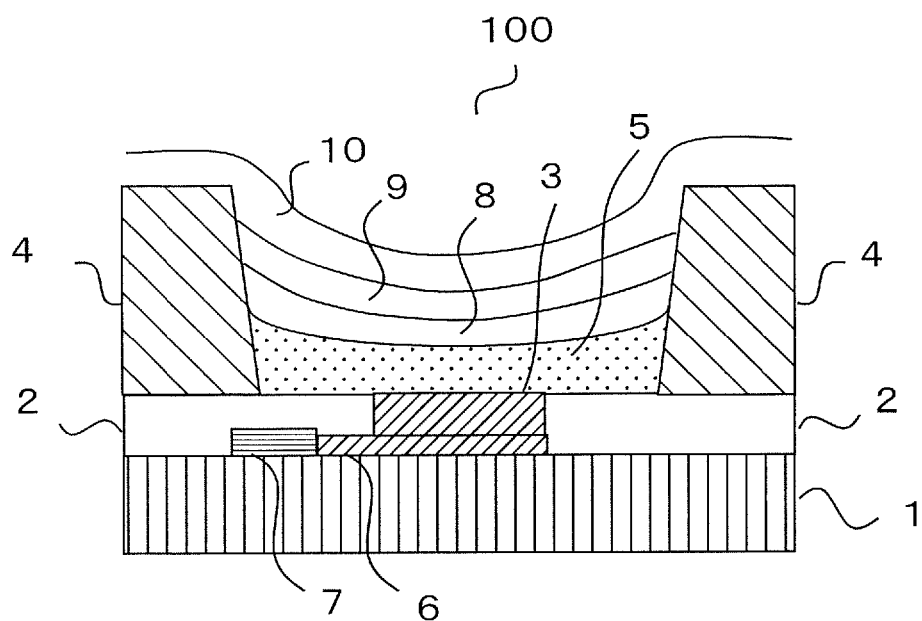
FIG. 1A is a schematic section view illustrating a configuration of an organic EL element of a first embodiment.

FIG. 1A is a schematic section view illustrating a configuration of an organic EL element 100 of the first embodiment of the present disclosure that is functionable as a pixel portion of a display panel or a light emitting portion of an illumination light source.

In FIG. 1A, the organic EL element 100 includes a substrate 1, an insulating layer 2, a plug 3 formed of a low contact angle material, a bank 4, a lower electrode 5, a connecting electrode 6, a TFT 7 which is a driving transistor, an light emitting layer 8, a hole injection layer 9 and an upper transparent electrode 10.

It is noted that a plurality of organic EL elements is arrayed one-dimensionally or two-dimensionally in a case where the organic EL element 100 of the present embodiment is used as a pixel of a display panel or an element of a surface light source (these will be referred to collectively as a 'pixel' in the following description). In such a case, it is possible to let the bank 4 function as a wall parting the pixels by forming into a stripe or lattice-shaped pattern. Still further, in a case where there is a plurality of pixels, it is possible to use the upper transparent electrode 10 of each pixel as a common electrode by electrically connecting the upper transparent electrode 10 by forming into an integrated film.

The organic EL element 100 is provided with a sealing structure not illustrated in order to protect the element from external factors such as moisture and impact. It is possible to use a sealing structure in which a low moisture permeable material such as glass is adhered by adhesive such as UV hardening resin and glass frit. It is also possible to use a sealing structure in which the organic EL element 100 is covered by a low moisture permeable inorganic film such as SiN and SiO and by laminated films of a resin film and a low moisture permeable inorganic film. A material having high light transmittance such as glass and SiN is preferably used because the present embodiment features in the top emission structure.

The substrate 1 is a substrate of the organic EL element 100 and is composed of an inorganic material such as glass or an organic material such as resin. Although the substrate 1 is typically a plate-like member, its form is not limited as long as it functions as a substrate. For example, the substrate 1 may be a deformable film.

The insulating layer 2 is provided on the substrate 1 by using typically an inorganic insulating material such as $SiO_2$. While FIG. 1A illustrates the insulating layer 2 as a monolayer for convenience of illustration, a plurality of layers may be laminated and a resin material such as acrylic resin and polyimide resin may be used.

The insulating layer 2 covers the TFT 7 and a part of the connecting electrode 6, and an upper surface thereof is planarized. Besides providing an wiring layer and a thin film transistor between the substrate 1 and the insulating layer 2 as illustrated in FIG. 1A, they may be provided between a plurality of insulating layers or on an insulating layer. The insulating layer 2 may be provided for various purposes of electrically insulating the wiring layer and the thin film transistor, of providing a flat base for an upper layer or of blocking a component of the substrate 1 and moisture from infiltrating into the upper layer. The plug 3 formed of a low contact angle material is formed at a center area within a region in which the insulating layer 2 is provided, and the bank 4 is formed on the insulating layer 2 so as to surround the plug 3.

The plug 3 which is a metal layer composed of the low contact angle material is a conductive layer provided at the center area of the insulating layer 2 and contains at least one of W, Al, Ti, Mo and Ta and their alloy material. The plug 3 electrically connects the connecting electrode 6 with the lower electrode 5 and acts as a base of a low contact angle material in forming the lower electrode 5.

Here, the low contact angle material refers to a material whose contact angle to nanoparticle dispersed ink to be coated in forming the lower electrode 5 is small as compared to that of an upper face of the insulating layer 2. An action of the low contact angle material as the base of the lower electrode will be described later.

The TFT 7 is a thin film transistor for applying voltage to the lower electrode 5 to drive the pixel and is electrically connected with the lower electrode 5 through the connecting electrode 6 and the plug 3.

The bank 4 is a wall provided on the insulating layer 2 so as to surround the plug 3 while keeping a space. An insulating material is preferably used as a material of the bank 4. In particular, a photosensitive epoxy resin containing fluororesin and resin materials such as acrylic resin and polyimide resin are preferably used. The bank 4 is a structure electrically separating the light emitting region, i.e., the pixel, and functions also as a partition preventing materials from being mixed across the pixels in coating liquid-phase materials as described later. It is noted that liquid repellency may be applied to the surface of the bank by performing a fluorine plasma treatment or the like.

The lower electrode 5 is an either pole of the organic EL element and is formed by way of applying a solution in which nanoparticles of silver and/or copper are dispersed, to the region surrounded by the bank, and of baking in high temperature. The lower electrode 5 functions typically as an electron injection layer and also as a mirror for enhancing light extracting efficiency by reflecting light heading toward the substrate 1 among light emitted from the light emitting layer 8.

The light emitting layer 8 may be made of any material as long as it has EL luminescent ability and may include a fluorescent organic compound or a phosphorescent organic compound corresponding to a desirable emission color. The light emitting layer 8 may also include a plurality of materials such as a guest material and a host material. The light emitting material includes a high molecular material, a middle molecular material or a low molecular material and is not specifically limited as long as the light emitting material is used as a coating type material. For instance, the light emitting material may be a high molecular material such as polyfluorene, a copolymer of polyfluorene and polyphenylene vinylene, a middle molecular material such as oligofluorene. Still further, the light emitting material may be a low molecular material such as condensed polycyclic compound such as fluorene-based, pylene-based, fluoranthene-based and anthoracene-based compounds and metal complex such as iridium complex.

The hole injection layer 9 is a layer for injecting holes into the light emitting layer 8. Any material may be used for the hole injection layer 9 as long as the material has a hole injection property, and PEDOT/PSS that is widely used for a coating type organic EL element may be used. However, the material is not specifically limited to the PEDOT/PSS.

The upper transparent electrode 10 is another electrode of the organic EL element and is composed of a conductive material having optical transparency such as oxide metal. Typically, the upper transparent electrode 10 supplies holes and also functions as a light extraction window. The upper transparent electrode 10 is connected with a driving circuit in a region not illustrated. The upper transparent electrode 10 is formed by means of vacuum deposition such as sputtering or of coating.

It is noted that although the light emitting layer 8 and the hole injection layer 9 are provided as functional layers between the upper transparent electrode 10 and the lower electrode 5 in the present embodiment, the layer structure of the functional layers is not limited to this case. For instance, the layer structure may be a monolayer of only the light emitting layer without providing the hole injection layer, a three-layer structure of hole injection layer/hole transport layer/light emitting layer, a three-layer structure of hole injection layer/light emitting layer/electron transport layer or a four-layer structure of hole injection layer/hole transport layer/light emitting layer/electron transport layer. Still further, the functional layers may be laminated inversely from the upper transparent electrode to the lower electrode. It is noted that there is a case where the layer other than the light emitting layer within the functional layer is called simply as an intermediate layer, and a processing step of forming these layers is called as an intermediate layer material applying process. When voltage is applied to the functional layer from the upper transparent electrode and the lower electrode, holes are injected from an anode and electrons are injected from a cathode to the functional layer, thus irradiating light when the holes and the electrons thus injected are recombined in the light emitting layer.

Figure 1B:
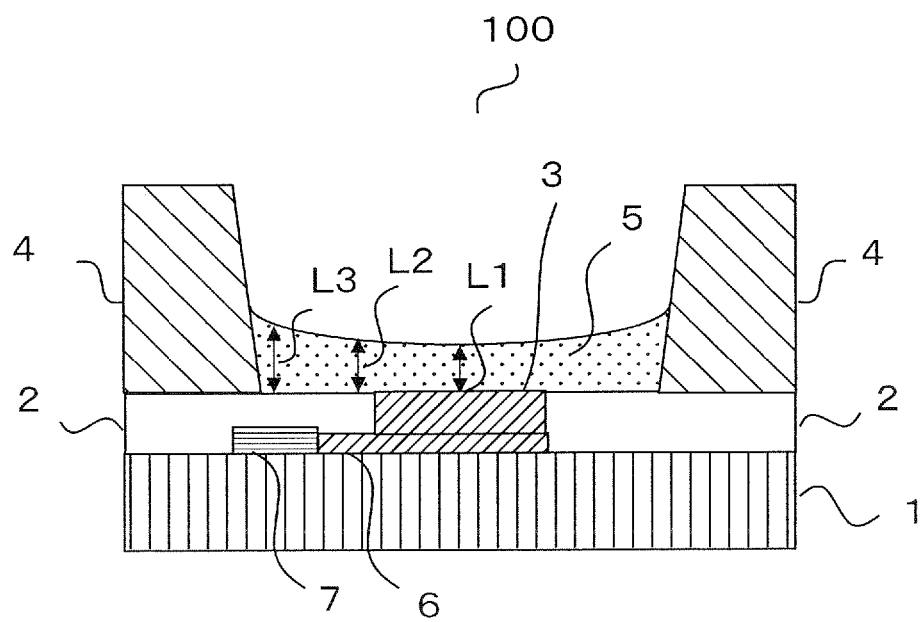
FIG. 1B is a schematic section view illustrating a configuration of a lower electrode of the first embodiment.

Next, a feature of the lower electrode of the present embodiment will be described with reference to FIG. 1B. FIG. 1B is a schematic section view illustrating only a part provided on the substrate of the organic EL element 100 for convenience. The lower electrode 5 covers the plug 3 and an upper surface of the insulating layer 2 where the bank 4 is not disposed.

Thicknesses of the lower electrode 5 are set as L1 at the center area, as L2 between the center area and the bank 4 and as L3 at a boundary with the bank 4. Then, while L3>L2>L1 as illustrated in FIG. 1B, differences of the respective thicknesses are small and the film thickness is highly uniform.

As another preferable configuration, there is one satisfying L1>L2 and L3>L2. In other words, the thickness of the lower electrode 5 reduces once from the boundary with the bank 4 toward the center area and increases again.

In any case, the thickness L1 of the center area of the lower electrode 5 with respect to the thickness L3 at the boundary with the bank 4, i.e., L1/L3, is 0.75 or more, is desirable to be 1.0 or more and is more desirable to be 1.2 or more.

According to a typical example of the present embodiment, L1 is 150 nm, L2 is 170 nm and L3 is 200 nm, and there is almost no difference in terms of the packing density of the metal material at the center area and at the peripheral area of the lower electrode.

The thickness of the center area is liable to be small and the packing density of the metal material is also liable to be low as compared to those of the peripheral area, i.e., in the vicinity of the bank in the conventional lower electrode. As compared to that, the thickness of the center area with respect to the peripheral area is fully assured and the packing density of the metal material of the center area is assured to be equal or to be more than that of the peripheral area in the lower electrode 5 of the present embodiment. Due to that, uniformity of light reflectance is enhanced within the pixel, and an effective value of the light extracting efficiency of the organic EL element can be increased. It is noted that the packing density of the metal material described above can be found by observing a cross section of the lower electrode by a SEM image or a STM image and by measuring a ratio of areas of metal and voids. The light reflectance of the lower electrode can be found by vertically inputting light equal with light emitting wavelength of the light emitting layer to an electrode surface and by measuring reflected light in a condition in which the functional layer and the upper transparent electrode are removed.

According to the present embodiment, the plug 3 of the metal material having the contact angle, to the nanoparticle dispersed ink to be coated, smaller than that of the insulating layer 2 is disposed at the center area of the element surrounded by the bank as the base of the lower electrode. Then, the ink in which the nanoparticles of the metal material are dispersed is dropped to the region surrounded by the bank by a coating technique typified by the inkjet method to form the lower electrode.

According to the present embodiment, a dot dropped initially is liable to accumulate at the center area by making the contact angle of the center area to the ink smaller than that of the circumference thereof. As a result, fine particles within the ink are liable to be left at the center area after drying. If the ink is dropped further in such condition, the coating material dropped afterward is also liable to accumulate at the center area because the center area is in affinity with the ink due to the influence of the fine particles left at the center area. As a result, it is possible to obtain a film in which the film thickness is fully thick and the packing density is high even at the center area. This effect is clear if there is a difference of the contact angle of 30° or more between the center area and the peripheral area. Meanwhile, if the difference exceeds 70°, the ink does not wetly spread within the element and the film quality of the peripheral area drops. Accordingly, the difference of the contact angle is preferable to be less than 70°.

In order to locally make the contact angle smaller at the center area of the element, metal such as Ti, Mo, W, Al, Ta or the like is disposed in the center area to differentiate from the surrounding planarization layer. Such surface can be formed by planarizing after disposing the metal by providing the contact plug in the center area of the element like the present embodiment. In a case where the center area is thus formed of the metal surface, it is preferable because it becomes possible to make the contact angle smaller at the center area by using the conductive nanoparticle dispersed ink using an oil-based solvent such as terpineol.

Manufacturing Method

Next, a manufacturing method of the organic EL element 100 of the present embodiment will be described with reference to FIGS. 2A through 2E and FIGS. 3A through 3D.

Figure 2A:
FIG. 2A is a schematic diagram illustrating a manufacturing step of the organic EL element of the first embodiment.

At first, the substrate 1 is prepared as illustrated in FIG. 2A.

Figure 2B:
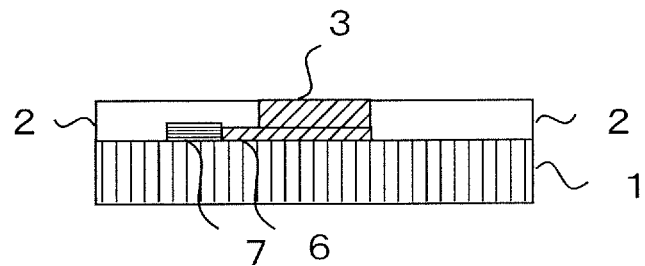
FIG. 2B is a schematic diagram illustrating another manufacturing step of the organic EL element of the first embodiment.

Next, a structure as illustrated in FIG. 2B is formed. That is, the connecting electrode 6 and the TFT 7 are provided on the substrate 1, and the insulating layer 2 is formed thereon. Then, a through-hole is perforated at the center area of the insulating layer 2 to fill the metal material to form the plug 3. Still further, CMP or the like is performed to planarize the upper surface.

Figure 2C:
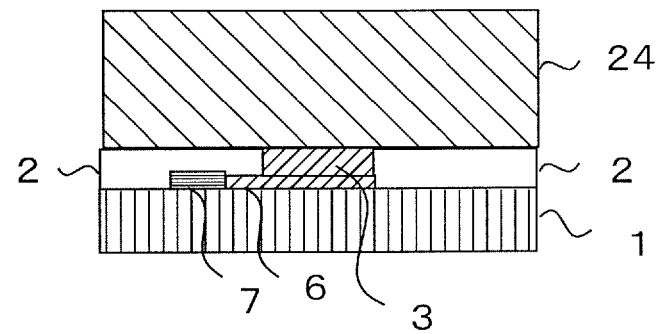
FIG. 2C is a schematic diagram illustrating a further manufacturing step of the organic EL element of the first embodiment.

Next, an insulating layer 24 not patterned is formed by a photosensitive resin material as illustrated in FIG. 2C.

Figure 2D:
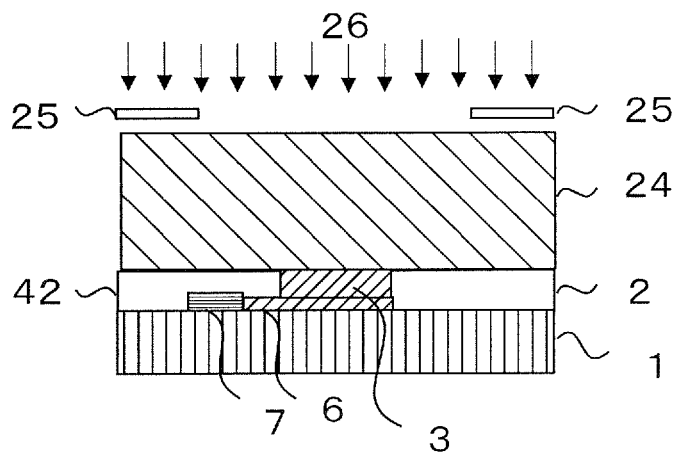
FIG. 2D is a schematic diagram illustrating a still further manufacturing step of the organic EL element of the first embodiment.

Next, the insulating layer 24 is irradiated with UV light 26 through an exposure mask 25 to expose and pattern the insulating layer 24 as illustrated in FIG. 2D.

Figure 2E:
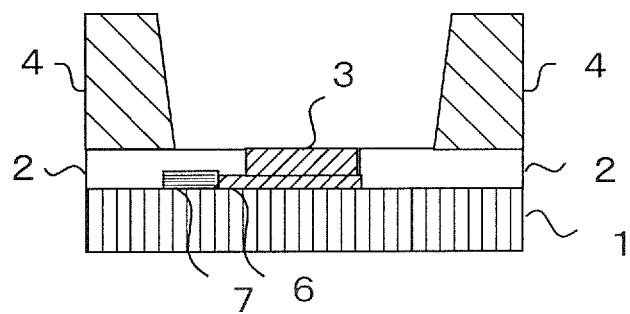
FIG. 2E is a schematic diagram illustrating a still further manufacturing step of the organic EL element of the first embodiment.

After that, the bank 4 is formed by developing by developer as illustrated in FIG. 2E. The bank 4 can be patterned without eroding the insulating layer 2 and the plug by appropriately selecting materials of the insulating layer 2, the plug and the bank and the developer. After patterning, a UV ozone treatment or an $O_2$ plasma treatment may be performed to remove residual materials. A fluorine plasma treatment may be performed on the surface of the bank in order to apply liquid repellency.

Figure 3A:
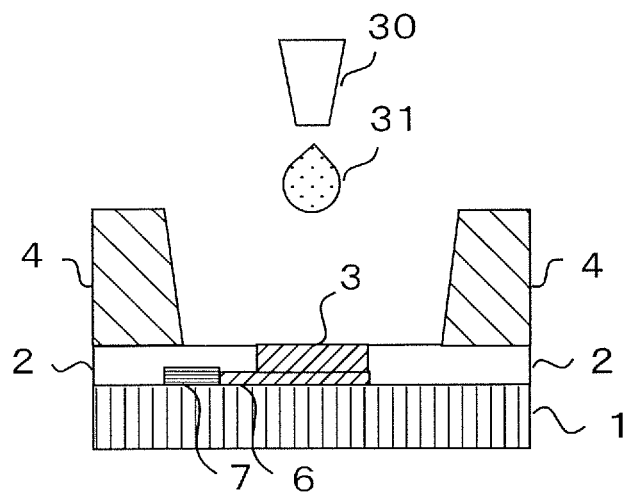
FIG. 3A is a schematic diagram illustrating a next manufacturing step of the organic EL element of the first embodiment.
Figure 3B:
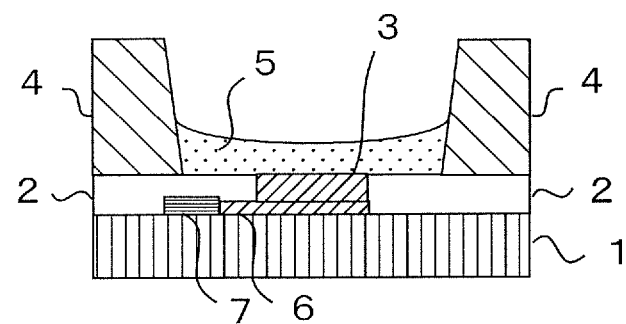
FIG. 3B is a schematic diagram illustrating a further manufacturing step of the organic EL element of the first embodiment.

Next, a coating unit 30 is used to coat a solution 31 containing the material of the lower electrode in the region surrounded by the bank 4 as illustrated in FIG. 3A (lower electrode material applying step). While an inkjet unit is preferably used as the coating unit 30, another liquid-phase unit such as a dispenser may be also used. The solution in which silver and/or copper nanoparticles are dispersed may be used as the solution 31. The solution 31 containing the material of the lower electrode is applied so as to coat the plug 3 and the upper surface of the region of the insulating layer 2 where the bank 4 is not disposed. After applying a number of droplets according to a need, baking is performed in appropriate temperature of 100° C. to 200° C. to form the lower electrode 5 as illustrated in FIG. 3B.

Figure 3C:
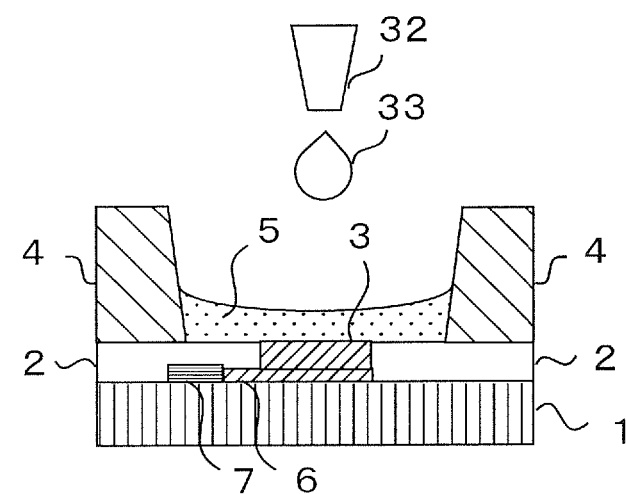
FIG. 3C is a schematic diagram illustrating a still further manufacturing step of the organic EL element of the first embodiment.
Figure 3D:
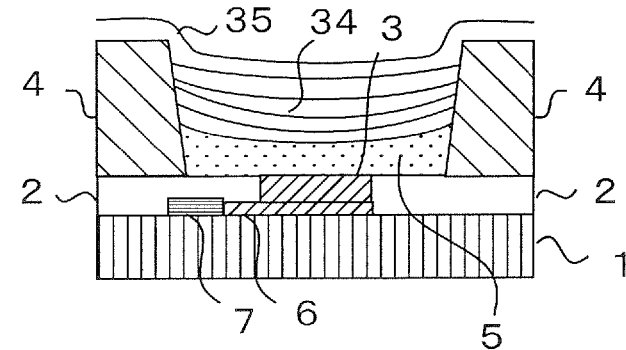
FIG. 3D is a schematic diagram illustrating a still further manufacturing step of the organic EL element of the first embodiment.

Next, a coating unit 32 is used to coat a solution 33 containing a material of a functional layer 34 in the region surrounded by the bank 4 as illustrated in FIG. 3C. In a case where the light emitting layer and the hole injection layer or the like are sequentially laminated as the functional layers, a solution containing a material of each layer is applied sequentially.

In order to form the light emitting layer, a solution containing a fluorescent organic compound or a phosphorescent organic compound in accordance with a desirable emission color is applied (light emitting material applying step). The light emitting layer may also include a plurality of materials such as a guest material and a host material. The light emitting material contained in the solution includes a high molecular material, a middle molecular material or a low molecular material and is not specifically limited as long as the light emitting material is used as a coating type material. For instance, the light emitting material may be a high molecular material such as polyfluorene, a copolymer of polyfluorene and polyphenylene vinylene, a middle molecular material such as oligofluorene. Still further, the light emitting material may be a low molecular material such as a condensed polycyclic compound such as fluorene-based, pylene-based, fluoranthene-based and anthoracene-based compounds and metal complex such as iridium complex.

For instance, in order to form a red light emitting layer, a red light emitting layer coating solution containing red phosphorescent emitting iridium metal complex as a guest material and polyfluorene as a host material is used. Still further, in order to form a green light emitting layer, a green light emitting layer coating solution containing a fluoranthene-based condensed polycyclic compound as a guest material and polyfluorene as a host material is used. Still further, in order to form a blue light emitting layer, a blue light emitting layer coating solution containing a pylene-based condensed polycyclic compound as a guest material and oligofluorene as a host material is used.

In order to form the hole injection layer, the PEDOT/PSS solution which is the hole injecting material for example is applied (hole injection layer forming step).

After thus completing the formation of the functional layers, a transparent conductive film 35 is coated so as to cover the functional layer 34 and the bank 4 by means of sputtering process (upper transparent electrode forming step).

The organic EL element 100 as illustrated in FIG. 1A is thus manufactured as described above.

According to the present embodiment, as a result of providing the member of the low contact angle material by processing the center area within the region where the insulating layer is provided, the electrode material fine particles around the center area are hard to be attracted to the peripheral area in manufacturing the organic EL element. This arrangement makes it possible to fully assure the density and the thickness also at the center area of the lower electrode and to readily manufacture the top emission organic EL element having the high light extracting efficiency.

Second Embodiment

A top emission organic EL device and a manufacturing method thereof of a second embodiment of the present disclosure will be described below with reference to the drawings.

Structure of Organic EL Element

Figure 4A:
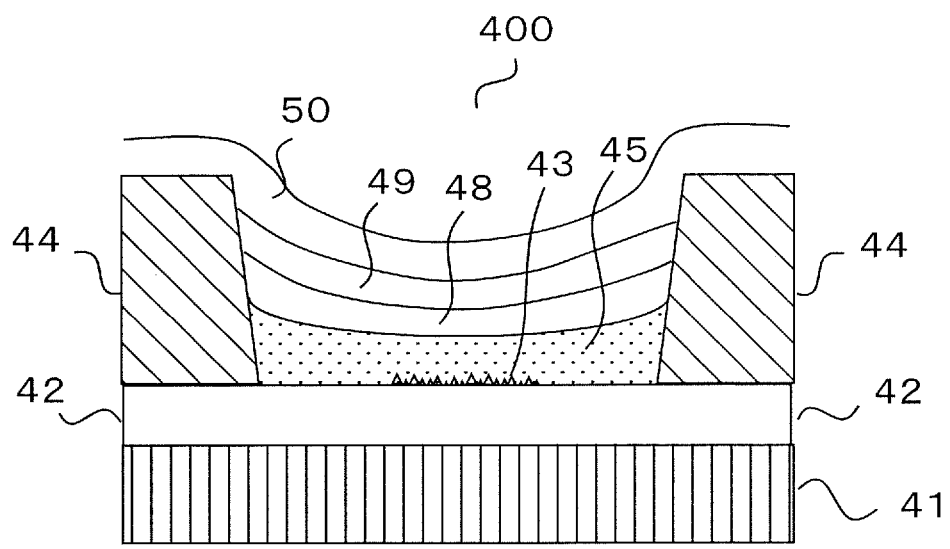
FIG. 4A is a schematic section view illustrating a configuration of an organic EL element of a second embodiment.

FIG. 4A is a schematic section view illustrating a configuration of an organic EL element of the second embodiment of the present disclosure functionable as a pixel portion of a display panel or a light emitting portion of an illumination light source.

In FIG. 4A, the organic EL element 400 includes a substrate 41, an insulating layer 42, a roughened surface region 43 formed at a center area of the insulating layer 42, a bank 44, a lower electrode 45, a light emitting layer 48, a hole injection layer 49 and an upper transparent electrode 50.

It is noted that a plurality of organic EL elements 400 is arrayed one-dimensionally or two-dimensionally in a case where the organic EL element 400 of the present embodiment is used as a pixel of a display panel or an element of a surface light source. In such a case, it is possible to let the bank 44 function as a wall parting the pixels by forming into a stripe or lattice-shape pattern. Still further, it is possible to use the upper transparent electrode 50 of each pixel as a common electrode by electrically connecting the upper transparent electrode 50 by forming into an integrated film.

Because a sealing structure not illustrated and materials used for the substrate 41, the insulating layer 42, the bank 44, the light emitting layer 48, the hole injection layer 49 and the upper transparent electrode 50 provided in the organic EL element 400 are approximately the same with those of the first embodiment, their description will be omitted here. Still further, a description concerning variations of the functional layers between the lower electrode and the upper transparent electrode is the same with the first embodiment, it will be omitted here.

The lower electrode 45 is an either pole of the organic EL element and is formed by way of coating a solution in which nanoparticles of silver and/or copper are dispersed to the region surrounded by the bank and of by baking in high temperature after that. The lower electrode 45 functions typically as an electron injection layer and also as a mirror for enhancing light extracting efficiency by reflecting light heading toward the substrate 41 side among light emitted by the light emitting layer 48. The lower electrode 45 will be detailed later.

Figure 4B:
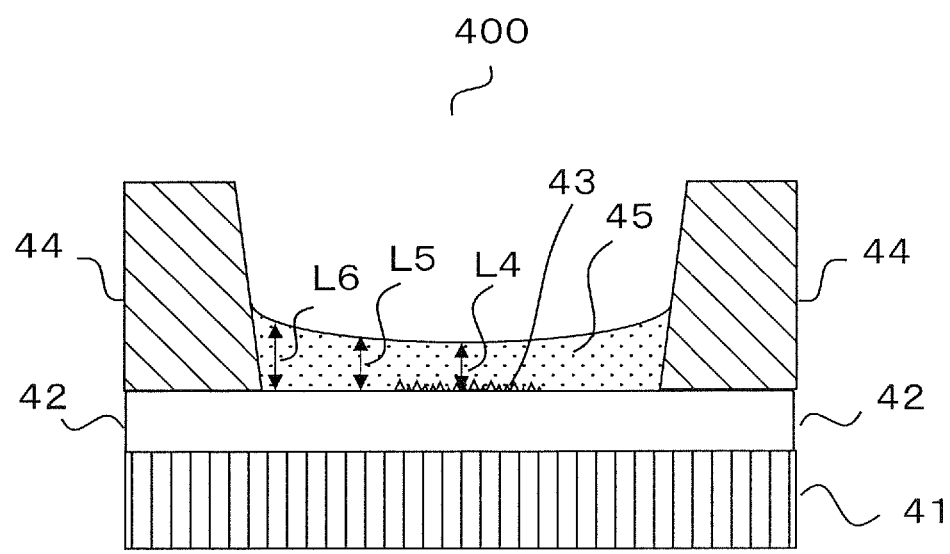
FIG. 4B is a schematic section view illustrating a configuration of a lower electrode of the second embodiment.

Next, a feature of the lower electrode of the present embodiment will be described with reference to FIG. 4B. FIG. 4B is a schematic section view illustrating only a part, provided on the substrate, of the organic EL element 400 for convenience. The lower electrode 45 of the present embodiment covers an upper surface of the insulating layer 42 in the region where the bank 44 is not disposed.

Thicknesses of the lower electrode 45 are set as L4 at the center area, as L5 between the center area and the bank 44 and as L6 at a boundary with the bank 44. Then, while L6>L5>L4 as illustrated in FIG. 4B, differences of the respective thicknesses are small and the film thickness is highly uniform.

As another preferable configuration, there is also one satisfying L4>L5 and L6>L5. In other words, the thickness of the lower electrode 45 reduces once from the boundary with the bank 44 toward the center area and increases again.

In any case, the thickness L4 of the center area of the lower electrode 45 with respect to the thickness L6 at the boundary with the bank 44, i.e., L4/L6, is 0.75 or more, is desirable to be 1.0 or more and is more desirable to be 1.2 or more.

According to a typical example of the present embodiment, L4 is 150 nm, L5 is 170 nm and L6 is 200 nm, and there is almost no difference in terms of the packing density of the metal material in the center area and the peripheral area of the lower electrode.

The thickness of the center area is liable to be small and the packing density of the metal material to be low as compared to those of the peripheral area, i.e., in the vicinity of the bank, in the conventional lower electrode. As compared to that, the thickness of the center area with respect to the peripheral area is fully assured and the packing density of the metal material of the center area is assured to be equal or to be more than that of the peripheral area in the lower electrode 45 of the present embodiment. Due to that, uniformity of light reflectance is enhanced within the pixel, and an effective value of the light extracting efficiency of the organic EL element can be increased. It is noted that the packing density of the metal material described above can be found by observing a cross section of the lower electrode by a SEM image or a STM image and by measuring a ratio of areas of metal and voids. The light reflectance of the lower electrode can be found in the same manner with the first embodiment.

According to the present embodiment, the roughened surface region 43 having the contact angle to the nanoparticle dispersed ink to be coated is smaller than that of the flat surface of the insulating layer 42 is disposed at the center area of the element surrounded by the bank as the base of the lower electrode. Then, a droplet of the ink in which the nanoparticles of the metal material are dispersed is applied to the region surrounded by the bank by a coating technique typified by the inkjet method to form the lower electrode.

According to the present embodiment, a dot dropped initially is liable to accumulate at the center area by making the contact angle to the ink smaller than that of the circumference thereof by processing the center area. As a result, the fine particles within the ink are liable to be left at the center area after drying. If the ink is dropped further in such condition, the coating material dropped afterward is also liable to accumulate at the center area because the center area is in affinity with the ink due to the influence of the fine particles left at the center area. As a result, it is possible to obtain a film which is fully thick and the packing density is high even at the center area. This effect is clear if there is a difference of the contact angle of 30° or more between the center area and the peripheral area. Meanwhile, if the difference exceeds 70°, the ink does not wetly spread within the element and the film quality of the peripheral area drops.

In order to locally make the contact angle small at the center area of the element, the rough surface having a low flatness as compared to the surrounding flat surface can be formed by performing blasting or various etching processes selectively at the center area of the insulating layer 42. Affinity of the surface which is initially in affinity with the ink can be enhanced by roughening the surface. In roughening the surface, a range of an arithmetic mean roughness of more than 30 nm and less than 100 nm is a value suited for expressing the affinity to the ink. In a case where the center area is roughened, it is possible to use various inks such as aqueous ink besides the oil-based ink using terpineol for example as a solvent as the conductive nanoparticle dispersed ink to be used.

Manufacturing Method

A manufacturing method of the organic EL element 400 of the present embodiment is different from that of the first embodiment in that a process of selectively roughening the surface of the center area of the insulating layer is performed without providing the metal member at the center area after forming the insulating layer. While, a manufacturing method of the insulating layer 42 of the present embodiment is roughly the same with the manufacturing method of the insulating layer 2 of the first embodiment, a mask opening at the center area is formed after forming the insulating layer, and dry-etching, wet-etching or blasting is performed on the center area. The manufacturing methods of the bank 44, the functional layer and the upper transparent electrode are almost same with those of the first embodiment, so that their description will be omitted here.

According to the present embodiment, as a result of providing the low contact angle region by roughening the center area of the insulating layer 42, the electrode material fine particles around the center area are hardly attracted to the peripheral area during manufacturing. This arrangement makes it possible to fully assure the density and the thickness at the center area of the lower electrode and to readily manufacture the top emission organic EL element having the high light extracting efficiency.

First Example

A concrete example of the lower electrode of the first embodiment will be described. At first, a driving TFT is formed on a glass substrate for forming the element. Next, a contact hole is defined by photolithographic etching at a position corresponding to the center area in the region surrounded by the bank. Next, after filling the contact hole with Al by plating, an upper surface is planarized by CMP. An area of the plug is about one-tenth of an area of the region surrounded by the bank.

Still further, an ink repellent treatment is performed on the side surface of the bank so as to have a contact angle of 60 to 70° to the silver nanoparticle dispersed ink (manufactured by Daiken Chemical Co., Ltd. NAG series).

The contact angle to the ink of the upper surface of the center area, i.e., the plug, is 15° and the contact angle to the ink of the upper surface of the peripheral area, i.e., the insulating layer, is 70°.

In this condition, five droplets of 1 pl, i.e., 5 pl in total, of the silver nanoparticle dispersed ink (manufactured by Daiken Chemical Co., Ltd. NAG series) whose main solvent was terpineol and having 10 nm of average particle size and 50 wt % of solid content ratio was coated within the region surrounded by the bank. After drying the solvent, baking was performed to form the lower electrode.

The thicknesses of the respective parts of the lower electrode were 160 nm at L1, 170 nm at L2 and 200 nm at L3. The packing density of the electrode material at the center area and at the peripheral area of the lower electrode were both 80% of a bulk material and were equal.

When the reflectance was measured by inputting a beam equal with emission wavelength of the light emitting layer vertically into the electrode surface, the reflectance of the center area and of the peripheral area of the example were both 90% based on reflectance of the flat surface of the bulk material.

Second Example

A concrete example of the lower electrode of the second embodiment will be described. After forming the insulating layer on the glass substrate, the resist mask which is opened at a region corresponding to the center area was formed to roughen this opened region by around 70 nm of arithmetic mean roughness by blasting. Then, after peeling off the mask and fully cleaning the insulating layer, the bank was formed so as to surround the roughened region, and the ink repellent treatment was performed on the side surface of the bank so as to have a contact angle of 60 to 70° to the silver nanoparticle dispersed ink. The contact angle to the ink of the center area, i.e., the rough surface, was 20° and the contact angle to the ink of the peripheral area, i.e., the upper surface of the peripheral area, was 70°.

In this condition, 5 pl in total of the silver nanoparticle dispersed ink (manufactured by Daiken Chemical Co., Ltd. NAG series) whose main solvent is undecane and having 10 nm of average particle size and 50 wt % of solid content ratio was coated to the substrate by the inkjet method to form the electrode layer.

The thicknesses of the respective parts of the lower electrode were 150 nm at L4, 170 nm at L5 and 200 nm at L6. The packing density of the electrode material at the center area and at the peripheral area of the lower electrode were both 80% of a bulk material and were equal.

When the reflectance was measured by inputting a beam equal with emission wavelength of the light emitting layer vertically into the electrode surface, the reflectance of the center area and the peripheral area of the example were both 90% based on the reflectance of the flat surface of the bulk material.

First Comparative Example

Figure 5:
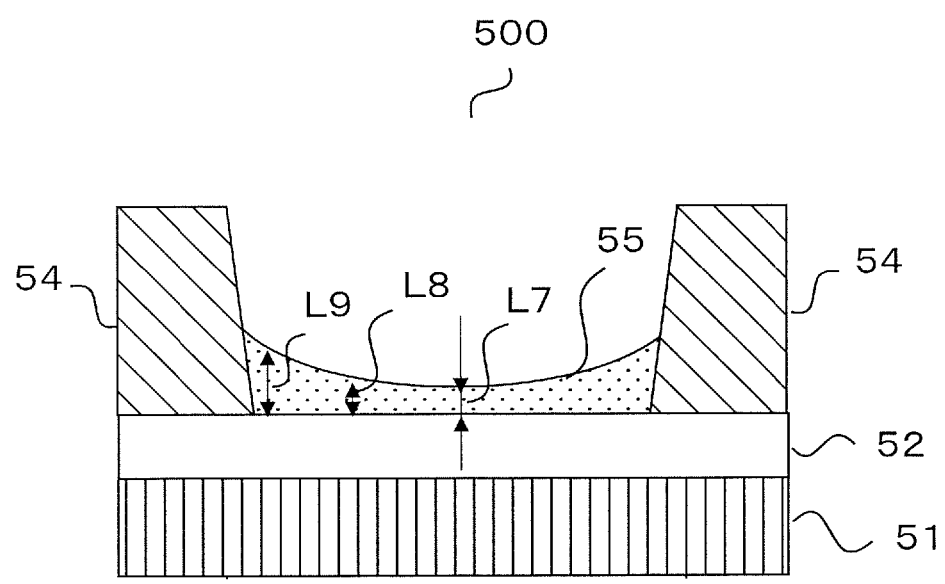
FIG. 5 is a schematic section view illustrating a configuration of a lower electrode of a comparative example.

As illustrated in FIG. 5, a lower electrode 55 was formed on a planar insulating layer whose upper surface is uniform. The ink repellent treatment was performed on the side surface of a bank 54 so as to have a contact angle of 60 to 70° to the silver nanoparticle dispersed ink in a configuration in which a planarized layer 52 and the bank 54 are provided on the glass substrate 51. Five droplets of 1 pl, i.e., 5 pl in total, of the silver nanoparticle dispersed ink (manufactured by Daiken Chemical Co., Ltd. NAG series) whose main solvent was undecane and having 10 nm of average particle size and 50 wt % of solid content ratio was coated to the substrate of this condition by the inkjet method to form the electrode layer after drying and baking.

The thicknesses of the respective parts of the lower electrode were 50 nm at L7, 100 nm at L8 and 400 nm at L9. Still further, while the packing density of the electrode material at the peripheral area of the lower electrode was 80% with respect to a bulk material, the packing density at the center area was only 30%.

When the reflectance was measured by inputting a beam equal with emission wavelength of the light emitting layer vertically into the electrode surface, while reflectance of the peripheral area of the comparative example was 90% based on the reflectance of the flat surface of the bulk material, reflectance at the center area was only 50%.

Result of Embodiment and Comparative Example

As described above, it can be seen that the difference between the film thicknesses of the center area and of the peripheral area is small and the difference of their packing density is small in the lower electrodes of the first and second examples as compared to those of the comparative example. As a result, the lower electrodes of the first and second examples exhibited the high reflectance not only at the peripheral area but also at the center area. When the functional layers and the upper transparent electrode were formed on the lower electrode of the examples and the comparative example to form the organic EL elements, it was confirmed that the elements of the two examples can achieve high luminance with less input power as compared to the element of the comparative example.

Other Embodiment

The embodiments of the present disclosure are not limited to the first and second examples described above and may be appropriately modified or may be combined.

For instance, while the metallic plug is provided at the center area of the substrate of the lower electrode in the first embodiment, the plug may not be always what transmits a driving signal as long as it is a member that can make a difference of the contact angle of the insulating layer at the peripheral area. For example, a metal thin film may be provided on the upper surface of the insulating layer at the center area.

Still further, while the roughened region was formed by selectively eroding the center area after forming the insulating layer in the second embodiment, the method for roughening the surface is not limited to be erosion and may be a method of sticking fine particles on the surface. In short, the contact angle to the solution coated in forming the lower electrode should be smaller at the center area of the insulating layer than that at the peripheral area.

According to the present disclosure, it is possible to fully assure the density and the thickness of the lower electrode even around the center area of the region surrounded by the bank and to readily manufacture the top emission organic EL element having the high light extracting efficiency.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-232095, filed Dec. 1, 2017, which is hereby incorporated by reference herein in its entirety.

What is claimed is:

1. A manufacturing method of a top emission organic EL element comprising:
   a step of providing an insulating layer on a substrate;
   a processing step of processing a center area within a region in which the insulating layer is provided such that a contact angle to a solution to be applied in forming a lower electrode becomes smaller at the center area than at a peripheral area of the center area within the region, the peripheral area being a part of a surface of the insulating layer;
   a step of forming a bank on the insulating layer so as to surround the region such that the bank surrounds the center area with the peripheral area interposed between the bank and the center area;
   a lower electrode material applying step of applying a solution containing materials of the lower electrode to the region surrounded by the bank;
   a luminescent material applying step of applying a solution containing materials of a light emitting layer to the region surrounded by the bank after the lower electrode material applying step; and
   an upper transparent electrode forming step of forming an upper transparent electrode after the luminescent material applying step.

2. The manufacturing method of the top emission organic EL element according to claim 1, wherein the processing step is a step of processing such that a difference of the contact angles to the solution at the peripheral area and at the center area becomes more than 30° and less than 70°.

3. The manufacturing method of the top emission organic EL element according to claim 1, wherein the step of providing the insulating layer is a step of providing the insulating layer so as to cover a driving transistor formed on the substrate.

4. The manufacturing method of the top emission organic EL element according to claim 1, wherein the processing step is a step of disposing a metal portion at the center area of the region surrounded by the bank.

5. The manufacturing method of the top emission organic EL element according to claim 4, wherein the metal portion contains at least one of W, Al, Ti, Mo, Ta and an alloy thereof.

6. The manufacturing method of the top emission organic EL element according to claim 1, wherein the processing step is a step of forming a plug for electrically connecting the lower electrode with a driving transistor.

7. The manufacturing method of the top emission organic EL element according to claim 1, wherein the processing step is a step of roughening the insulating layer of the center area.

8. The manufacturing method of the top emission organic EL element according to claim 7, wherein the processing step is a step of processing the insulating layer of the center area to be more than 30 nm and less than 100 nm in terms of arithmetic mean roughness.

* * * * *